United States Patent [19]

Sechi et al.

[11] Patent Number: 4,732,838
[45] Date of Patent: Mar. 22, 1988

[54] METHOD OF FORMING A PATTERNED GLASS LAYER OVER THE SURFACE OF A SUBSTRATE

[75] Inventors: Franco N. Sechi, Princeton Township, Mercer County; Paul F. Pelka, Wharton; Katherine E. Pinkerton, Flemington, all of N.J.

[73] Assignee: General Electric Company, Schenectady, N.Y.

[21] Appl. No.: 13,529

[22] Filed: Feb. 11, 1987

Related U.S. Application Data

[63] Continuation of Ser. No. 814,994, Dec. 31, 1985, abandoned.

[51] Int. Cl.$^4$ ............................................. G03C 11/00
[52] U.S. Cl. ................................... 430/198; 430/311; 430/325; 430/326; 430/330
[58] Field of Search ............... 430/198, 311, 325, 326, 430/330, 331

[56] References Cited

U.S. PATENT DOCUMENTS

| | | | |
|---|---|---|---|
| 3,935,330 | 1/1976 | Smith et al. | 427/41 |
| 3,982,941 | 9/1976 | Inskip | 430/198 |
| 4,201,579 | 5/1980 | Robinson et al. | 430/323 |
| 4,241,165 | 12/1980 | Hughes et al. | 430/269 |
| 4,278,753 | 7/1981 | Lewis et al. | 430/283 |
| 4,332,879 | 6/1982 | Pastor et al. | 430/272 |
| 4,619,836 | 10/1986 | Prabhu et al. | 427/41 |
| 4,623,556 | 11/1986 | Brown et al. | 427/41 |

*Primary Examiner*—John E. Kittle
*Assistant Examiner*—José G. Dees
*Attorney, Agent, or Firm*—Henry I. Steckler; Allen LeRoy Limberg

[57] ABSTRACT

Patterned glass layers which are defect-free and have smooth surfaces are formed by a method wherein a mixture of glass frit and a photoresist composition is applied to the surface of the substrate; the layer is photolithographically patterned by exposing and developing predetermined areas of the layer; then after development and prior to firing of the glass frit, the layer of material is subjected to treatment with a suitable plasma at a temperature below the thermal decomposition temperature of the photoresist composition to remove the photoresist composition from the portion of the resist layer remaining on the substrate; and then the remainder of the layer, consisting essentially of glass frit, is fired to form a smooth, defect-free, patterned glass layer over the surface of the substrate.

8 Claims, No Drawings

METHOD OF FORMING A PATTERNED GLASS LAYER OVER THE SURFACE OF A SUBSTRATE

The Government has rights in this invention pursuant to Contract No. F33615-84-C-1449 awarded by the Department of the Air Force.

This is a continuation of application Ser. No. 814,994, filed Dec. 31, 1985, now abandoned.

This invention relates to a novel method for forming a patterned glass layer over the surface of a substrate and, more particularly, is concerned with a method of forming a smooth, patterned, defect-free glass layer for planarizing the surface of a substrate used in the manufacture of a microwave integrated circuit device.

BACKGROUND OF THE INVENTION

It is conventional practice in the manufacture of semiconductor devices and, in particular, in the manufacture of integrated circuit devices, to form an ordered series of layers of different types of materials over the surface of a suitable substrate. After each individual layer of material is applied, it is generally patterned by forming a film of photoresist over the layer, selectively exposing areas of the film of photoresist, and developing the exposed film of photoresist with a suitable solvent to form a patterned photoresist mask over the layer of material. The exposed areas of the underlying layer of material are then selectively subjected to various treatments such as etching, ion implantation and the like. The film of photoresist remaining on the layer of material is then stripped from the surface of the layer of materials with a solvent for the photoresist or by etching away the film of photoresist with a plasma.

An alternate method has been suggested for forming a patterned glass layer wherein a layer of a mixture comprised of glass frit and a photoresist composition is applied over the surface of a substrate. The resulting layer is then selectively exposed. After exposure, the layer of the mixture is developed with a solvent which selectively removes the photoresist and the associated glass frit from predetermined areas of the layer of the mixture defined in the exposure step. The remainder of the layer of material is then fired at an elevated temperature to burn out the photoresist and to fuse the glass frit.

In the manufacture of semiconductor devices in general and particularly in the manufacture of the more recently developed miniature microwave integrated circuit devices, it is extremely important that the layers of material comprising the devices be essentially defect-free and that the surfaces of the layers be as smooth as possible.

In this regard, it should be noted that the microwave integrated circuits are typically manufactured by initially forming a substrate from an insulative material such as alumina, beryllium oxide or the like. The substrates typically included connectors such as plated-through holes or veins of conductive material at predetermined locations for making connections of the completed microwave device with a ground plane or the like. The surfaces of the substrates are highly polished. However, despite the careful polishing methods employed, the surface of the polished substrates still have pits formed in them, some of which are believed to be caused by tiny crystals of material being broken out from the surface of the substrate during polishing. It has been found that these minor defects in the substrate interfere with the proper operation of the completed microwave devices. To correct the defective surfaces, it has been suggested to form an insulative planarizing layer having an extremely smooth, defect-free surface except for a predetermined pattern of apertures defined therein corresponding to the positions of the conductors over the surface of the substrate.

Attempts have been made to form the patterned, smooth layer on the surface of the polished substrates using the methods generally outlined above. It has been suggested to use polyimide polymers to form the smooth layer but these polymers tend to blister and have excessively rough surfaces. Attempts were also made to form a glass layer using a mixture of glass frit and a photoresist composition. The mixture can be applied satisfactorily and photolithographically patterned; however, when the developed layer of the mixture of glass frit and the photoresist composition is fired, the photoresist is not completely removed with noticeable amounts of partially decomposed photoresist composition remaining in the fused glass frit. On re-heating the coated substrate during subsequent firings of other layers, the residual organic materials from the photoresist composition decomposed and formed gaseous materials within the fused glass layer. The gases that developed frequently caused blisters, voids and generally made the surface of the glass layer excessively rough so as to be unsuitable for a microwave device.

It would be highly desirable if a method could be provided which could be employed to form smooth defect-free patterned glass layers over the surface of substrates used for semiconductor devices and particularly microwave devices.

SUMMARY OF THE INVENTION

Patterned glass layers which are defect-free and have smooth surfaces are formed by a method wherein a mixture of glass frit and a photoresist composition is applied to the surface of the substrate; the layer is photolithographically patterned by exposing and developing predetermined areas of the layer; then after development and prior to firing of the glass frit, the layer of material is subjected to treatment with a suitable plasma at a temperature below the thermal decomposition temperature of the photoresist composition to remove the photoresist composition from the portion of the resist layer remaining on the substrate; and then the remainder of the layer, consisting essentially of glass frit, is fired to form a smooth, defect-free, patterned glass layer over the surface of the substrate.

DETAILED DESCRIPTION OF THE INVENTION

The initial step in the method of this invention is to prepare or obtain from various commercial sources, a suitable mixture comprised of glass frit and a photoresist composition. The glass frit which is used is selected based on its chemical and electrical properties. The glass frit should not be attacked by any of the agents or processess used in the manufacture of the semiconductor device. In addition, the glass transition temperature of the glass frit should be substantially above the thermal decomposition temperature of the photoresist composition and preferably should be about 800°–1000° C. The particle size of the glass frit should be as small as is practical to insure good packing of the glass frit particles prior to being fired.

The photoresist compositions which are used in the mixtures are comprised of a photoresist and usually also include an activator or accelerator and solvents to control the thickness of the final mixture. The various materials which comprise the photoresist composition must react with the plasma to be employed at a temperature below the thermal degradation temperature of the photoresist composition and, on reaction with the plasma, be converted into gaseous products which can readily escape from the porous glass frit layer. It has been found that organic photoresists are preferably employed in the present invention because they can be converted readily into carbon and oxygen containing gases and water, or low molecular weight hydrocarbon gases, depending on whether an oxidizing or reducing plasma is employed.

The photoresist compositions can be either negative or positive acting. When using a negative resist, such as a non-cross-linked or low molecular weight polymer, after exposure the exposed photoresist becomes relatively insoluble so that on solvent development the layer comprised of the mixture of glass frit and photoresist composition is removed from the unexposed areas of the layer of material. When using a positive resist, the photoresist composition in the exposed areas become more solvent soluble and therefore is removed during development. A large number of well-known different types of chemical classes of photoresists can satisfactorily be employed in this invention and include polymers such as polymethylmethacrylate, polybutene sulfone and the like.

The mixture of glass frit and the photoresist composition is applied in a uniform coating over the surface of the substrate. When a glass glaze is to be formed directly on the substrate, it is preferable to form a relatively low viscosity mixture of the glass frit and the photoresist composition and then spin coat the low viscosity mixture onto the surface of the substrate.

The coating of the mixture on the substrate is then preferably dried and baked prior to exposure. The resulting coating is then exposed to form a pattern of exposed and non-exposed areas in the coating corresponding to the predetermined pattern. The exposure is conducted with a source or radiation which will expose the particular type of photoresist composition employed, such as an ultraviolet radiation source, an electron beam or other well-known sources of radiation.

The exposed layer is then developed with a suitable solvent which selectively dissolves the more soluble portion of the photoresist. During development, the glass associated with the dissolved photoresist is removed from the substrate along with the solvent solution of the photoresist. After the exposed layer of material has been developed, it is preferable to again dry and bake the substrate.

The substrate with the residual photoresist-glass coating is then subjected to treatment with a plasma which will react selectively with the photoresist composition to convert the photoresist composition into gaseous products at a temperature below the thermal decomposition temperature of the photoresist composition and preferably at between 100°–150° C.

The plasma can be generated using a plasma reactor of various conventional well-known designs. The plasma can be an oxidizing plasma formed using oxygen or a mixture of oxygen with an inert gas such as argon. The oxygen or oxygen-containing gas mixture is continually introduced into the plasma reactor and the gaseous reaction products are continuously removed. The plasma readily penetrates the porous glass frit on the substrate to react with the photoresist composition and the resulting reaction gases readily escape from the porous glass frit. The plasma reaction is continued until substantially all of the photoresist composition is removed as indicated by a loss of weight of the substrate and coating or by monitoring the exhaust gases until they are free of carbon-oxygen reaction gas products.

In an alternate embodiment of this invention, the photoresist composition is removed with a reducing plasma, such as a plasma formed from hydrogen, water gas, or a mixture of hydrogen with and inert gas such as argon. The reducing plasma is particularly effective if there are oxidizable materials associated with the substrate such as copper connectors or the like. The reducing plasma not only does not react with the copper to oxidize it but indeed may remove any residual oxide present on the copper during the plasma reaction. The reducing plasma reaction is continued until substantially all the photoresist composition is removed from the residual coating on the substrate.

The coating remaining after the plasma reaction will be formed of all or essentially all glass frit particles. Surprisingly, however, despite the removal of the photoresist composition, the particles of the glass frit remain in position on the substrate. This may be due to a packing effect or be a result of coherent forces between the individual particles or a combination of both effects. Patentability, however, is not predicated on the reason or the mechanism by which the glass frit particles are held in position on the substrate.

The substrate with the glass frit pattern on the surface thereof is then fired at an elevated temperature, above the thermal decomposition temperature of the photoresist, and at least at the glass transition temperature of the glass frit until the glass frit particles fuse together to form a patterned glass layer on the surface of the substrate.

The resulting layer is crystal clear and free of residual organic materials and the predetermined pattern is precisely defined. The surface of the resulting glass layer is especially noteworthy because of its exceptional smoothness and freedom from defects such as lumps or pits. Furthermore, on re-firing to form additional layers over the substrate, the glass layer formed in accordance with this invention remains smooth as gas bubbles and the like do not form within the layer of glass.

While the method of the present invention is particularly well suited for forming patterned glass glazes directly on substrates to be used for the manufacture of microwave integrated circuits, it should be appreciated that the method of this invention can also be used for forming other types of patterned glass layers used in the manufacture of semiconductor devices.

What is claimed is:

1. A method for forming a fused glass layer having a predetermined pattern defined therein over a substrate, said method comprising the steps of:
   (a) applying a coating over the substrate, said coating being comprised of a mixture of (i) a photoresist composition which will react with a suitable plasma at a temperature below its thermal decomposition temperature to form gaseous reaction products and (ii) a glass frit having a glass transition temperature above the thermal decomposition temperature of the photoresist composition;
   (b) selectively exposing an area of the coating corresponding to the predetermined pattern to radiation;

(c) developing the coating to selectively remove the area of the coating corresponding directly to the predetermined pattern;

(d) completely removing said photoresist composition by subjecting the coating remaining over the substrate to said plasma at a temperature below the thermal decomposition temperature of the photoresist composition for a time sufficient for the plasma to react with the photoresist composition to form gaseous reaction products; and (e) firing the remaining glass frit coating at or above its glass transition temperature for a time sufficient to fuse the glass frit, thereby forming said patterned fused glass layer with a smooth surface over said substrate.

2. The method according to claim 1 wherein said photoresist composition is an organic material.

3. The method according to claim 1 wherein the photoresist composition is a negative photoresist and the unexposed area of the coating is removed during developing.

4. The method according to claim 1 wherein the photoresist composition is a positive photoresist and the exposed area of the coating is removed during developing.

5. The method according to claim 1 wherein the residual coating is subjected to an oxidizing gas plasma.

6. The method according to claim 1 wherein the residual coating is subjected to an oxygen plasma.

7. The method according to claim 1 wherein the residual coating is subjected to a reducing gas plasma.

8. The method according to claim 1 wherein the residual coating is subjected to a hydrogen plasma.

* * * * *